(12) United States Patent
Brady (10) Patent No.: US 6,246,603 B1
(45) Date of Patent: Jun. 12, 2001

(54) CIRCUIT AND METHOD FOR SUBSTANTIALLY PREVENTING IMPRINT EFFECTS IN A FERROELECTRIC MEMORY DEVICE

(75) Inventor: James Brady, Plano, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/607,781

(22) Filed: Jun. 30, 2000

(51) Int. Cl.$^7$ ..................................................... G11C 11/22

(52) U.S. Cl. .......................... 365/145; 365/190; 365/228; 365/226; 365/236; 365/233

(58) Field of Search ...................................... 365/145, 149, 365/226, 228, 190, 236, 233

(56) References Cited

U.S. PATENT DOCUMENTS 6,008,659 * 12/1999 Traynor ................................ 324/658

* cited by examiner

Primary Examiner—Andrew Q. Tran
(74) Attorney, Agent, or Firm—Theodore E. Galanthay; Lisa K. Jorgenson; Andre Szuwalski (57) ABSTRACT

A method and circuit are disclosed for maintaining stored data within a ferroelectric memory device. The circuit includes a first circuit for selectively logically inverting the data in the ferroelectric memory device. A second circuit enables the first circuit at the one or more predetermined times. A third circuit logically inverts data to be written to and data read from the ferroelectric memory device following every other predetermined time. In this way, the circuit is capable of inverting the data values stored in the ferroelectric memory device, thereby reducing the susceptibility of imprint.

47 Claims, 7 Drawing Sheets

CIRCUIT AND METHOD FOR SUBSTANTIALLY PREVENTING IMPRINT EFFECTS IN A FERROELECTRIC MEMORY DEVICE

BACKGROUND OF THE INVENTION

1. Technical Field of the Invention

The present invention relates to a ferroelectric memory device, and particularly to a circuit and method for providing a ferroelectric memory device having reduced imprint effects.

2. Background of the Invention

Ferroelectricity is a phenomenon which can be observed in a relatively small class of dielectrics called ferroelectric materials. In a normal dielectric, upon the application of an electric field, positive and negative charges will be displaced from their original position—a concept which is characterized by the dipole moment or polarization. This polarization or displacement will vanish, however, when the electric field returns back to zero. In a ferroelectric material, on the other hand, there is a spontaneous polarization—a displacement which is inherent to the crystal structure of the material and does not disappear in the absence of the electric field. In addition, the direction of this polarization can be reversed or reoriented by applying an appropriate electric field.

These characteristics result in ferroelectric capacitors, formed from ferroelectric film or material disposed between parallel conduction plates, being capable of storing in a nonvolatile manner a first charge corresponding to a first polarization state in which the direction of polarization is in a first direction, and a second charge corresponding to a second polarization state in which the direction of polarization is in a second direction opposite the first direction. Ferroelectric capacitors are utilized in nonvolatile random access memory devices having a memory cell array architecture that is similar to the memory cell array architecture of dynamic random access memory (DRAM) devices.

Figure 1A:
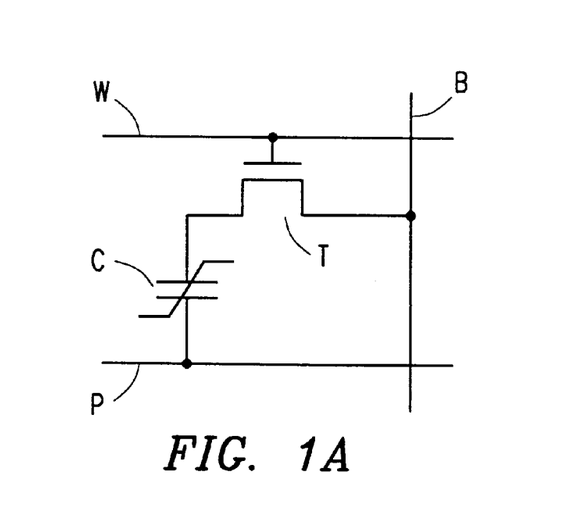
FIGS. 1A and 1B are known circuit schematics of 1T1C and 2T2C memory cells, respectively.

In general terms, there are two types of ferroelectric memory cells. Referring to FIG. 1A, a one transistor, one capacitor (1T1C) memory cell utilizes a pass gate transistor T connected between a bit line B and a first plate of ferroelectric capacitor C. A second plate of ferroelectric capacitor C is connected to a plate line P. The gate terminal of pass gate transistor T is connected to a word line W. A memory device utilizing a 1T1C memory cell uses a reference memory cell that is accessed at the same time the 1T1C memory cell is accessed so as to provide a charge differential appearing across a pair of bit lines coupled to the 1T1C cell and the reference cell. The use of 1T1C ferroelectric memory cells is known in the art.

Figure 1B:
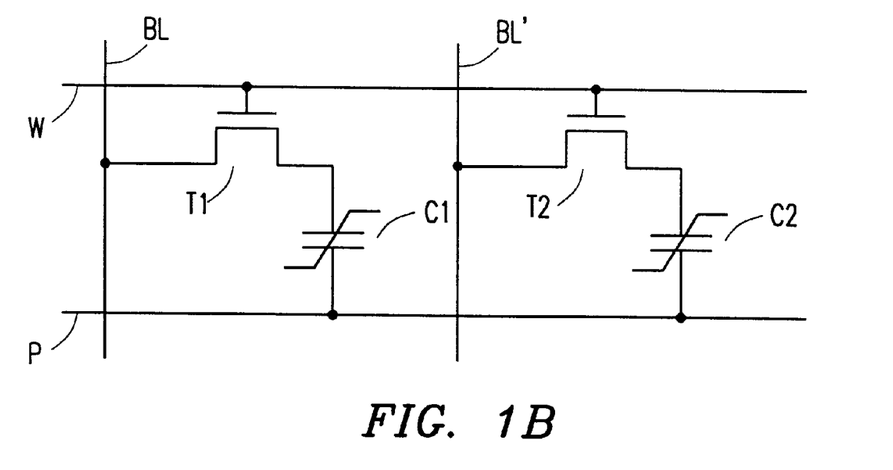

Referring to FIG. 1B, a two transistor, two capacitor (2T2C) memory cell includes two ferroelectric capacitors C1 and C2. A first pass gate transistor T1 is connected between a first plate of ferroelectric capacitor C1 and a first bit line BL of a bit line pair. A second pass gate transistor T2 is connected between a first plate of ferroelectric capacitor C2 and a second bit line BL' of the bit line pair. A second plate of ferroelectric capacitors C1 and C2 is connected to a plate line P. The gate terminal of pass gate transistors T1 and T2 is connected to the word line W. Each capacitor C1 and C2 stores a charge representative of the polarization state thereof, the charge combining with the charge of the other capacitor to result in a charge differential appearing across bit lines BL and BL' when the 2T2C memory cell is accessed. The polarity of the charge differential denotes the binary value stored by the 2T2C memory cell. The use of 2T2C ferroelectric memory cells is known in the art.

A problem with ferroelectric memory devices is the existence of a phenomenon known as imprint. Imprint is a characteristic of ferroelectric films that refers to the tendency of a ferroelectric film/capacitor to prefer one polarization state over another polarization state. Imprint is known to occur when a ferroelectric capacitor is maintained in a single polarization state for a prolonged period of time. Imprint adversely effects the ability of a ferroelectric capacitor to switch between the polarization states. Consequently, the existence of imprint may directly impact the performance of a ferroelectric memory device.

SUMMARY OF THE INVENTION

The present invention overcomes the shortcomings in prior systems and thereby satisfies a significant need for a ferroelectric memory device having reduced imprint effects. In accordance with an embodiment of the present invention, there is disclosed a ferroelectric memory device, including a plurality of ferroelectric memory cells and circuitry for conditioning or logically inverting the data value stored in each ferroelectric memory cell following an occurrence of at least one predetermined time and during a period when the ferroelectric memory device is not being accessed. By somewhat regularly inverting the data stored in the ferroelectric memory device and inverting the data read from and to be written to the ferroelectric memory device during the time the stored data is inverted, the occurrence of imprint is substantially reduced while maintaining integrity of the stored data.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE PREFERRED EXEMPLARY EMBODIMENTS

The present invention will now be described more fully hereinafter with reference to the accompanying drawings in which embodiments of the invention are shown.

Figure 2:
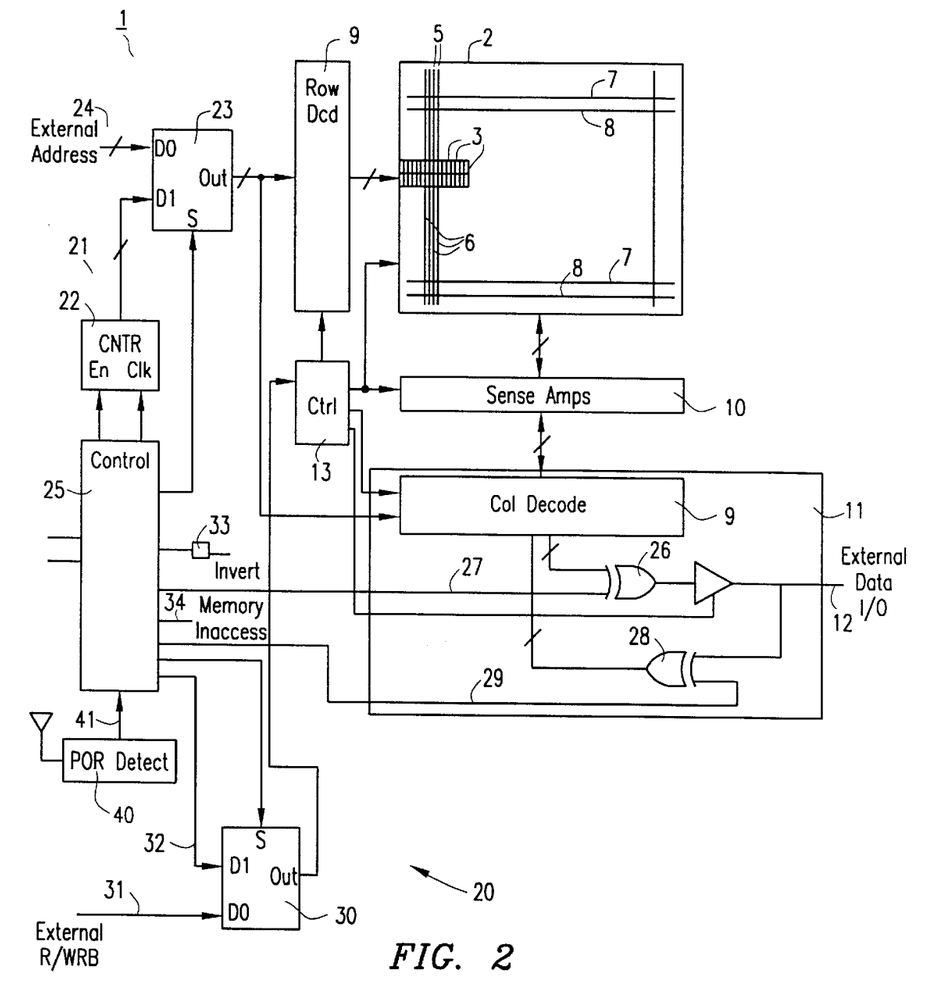
FIG. 2 is a function block diagram of a memory device according to a first embodiment of the present invention.

Referring to FIG. 2, there is shown a memory device 1 according to a first embodiment of the present invention. Memory device 1 is a nonvolatile memory device, such as a random access ferroelectric memory device. It is understood, however, that memory device 1 may be other memory devices as well. For instance, memory device 1 may include memory cells having elements other than ferroelectric capacitive elements that may be effected by phenomena similar to imprint.

Memory device 1 includes a memory cell array 2 of memory cells 3. Memory cells 3 may be ferroelectric memory cells that include one or more ferroelectric capacitor elements 4. Memory cell 3 may be implemented as a one transistor, one capacitor (1T1C) memory cell (FIG. 1A). Alternatively, memory cell 3 may be implemented as a two transistor, two capacitor (2T2C) memory cell (FIG. 1B).

It is understood that each memory cell 3 may be implemented in other ways using one or more ferroelectric capacitive elements or similar elements.

Memory cell array 2 is arranged into rows and columns of memory cells 3. The memory cells 3 in a row of memory cells 3 are connected to a distinct word line 7 and a distinct plate line 8. The memory cells 3 in a column of memory cells 3 are connected to a distinct bit line 6 or pair 5 thereof.

FIG. 2 shows plate lines 8 being parallel to word lines 7. In this configuration, plate lines 8 can be coupled to more than one row of memory cells 3. Alternatively, it is understood that plate lines 8 may be perpendicular to word lines 7. In this configuration, the voltage appearing across the ferroelectric capacitors in the memory cells 3 in rows that are not being accessed will not vary when the plate line 8 connected to such memory cells 3 is asserted. This is due to the fact that the transistor(s) in the unaccessed memory cells 3 are turned off, so the plate connected to the transistor simply follows the voltage change appearing on the capacitor plate connected to the asserted plate line 8. In either the parallel or perpendicular configuration, it is understood that back plate lines 8 may be partitioned into smaller segments so that back plate lines 8 may be more easily driven.

Memory device 1 further includes address logic 9, such as a row decoder circuit, which receives an address value and asserts a word line 7 and plate line 8 pair corresponding to the address value. Sense amplifiers 10 are controlled to sense a charge differential appearing across a pair of bit lines 6 and drive the bit lines 6 to the high voltage reference Vdd and low voltage reference Vss based upon the polarity of the charge differential. Input-output (I-O) block 11 serves as an interface between bit lines 6 and the external input/output (I/O) data bus 12, wherein pairs of bit lines 6 selected by the address value are connected thereto. A control circuit 13 provides necessary timing and control signals to memory cell array 2, address logic 9, sense amplifiers 10 and I-O block 11 to preform read and write memory access operations.

Memory device 1 is shown in FIG. 2 as having a bidirectional external data bus 12. It is understood that memory device 1 may include separate unidirectional data input and data output buses instead.

Memory device 1 includes circuitry to reduce the effect of imprint in ferroelectric capacitor elements within memory cells 3. In particular, memory device 1 includes inversion circuitry 20 for selectively conditioning and/or logically inverting the data value stored in each ferroelectric memory cell 3 at predetermined times and or at predetermined intervals, during periods when memory device 1 is not being accessed and/or during periods of memory access inactivity. In order to maintain data integrity, data values to be written to and to be read from memory cells 3 are conditioned and/or logically inverted during the time the data values in memory cell array 2 are logically inverted. By inverting the stored data values, the ferroelectric capacitor elements in memory cells 3 are not maintained at any one polarization state for an extended period of time, thereby substantially reducing the effects of imprint.

Inversion circuitry 20 may substantially automatically invert the data values stored in, read from and to be written to memory cell array 2. Although inversion circuitry 20 is shown in FIG. 2 as being within memory device 1, it is understood that inversion circuitry 20 may be external thereto. The data values stored in memory cell array 2 may be inverted by first reading and/or performing a read operation to read the data value stored in an addressed memory cell 3, inverting the data value read and thereafter writing and/or performing a write operation to write the inverted data value into the addressed memory cell 3. During the time inversion circuitry 20 is performing the data read, data inversion and data write operations, memory device 1 is not accessible by external devices.

In accordance with an embodiment of the present invention, inversion circuitry 20 may include addressing circuitry 21 which generates the addresses to access each memory cell 3. Addressing circuitry 21 may include a counter 22 or other address generation circuitry. Multiplexing logic 23 receives an external address 24 and the output of counter 22 and provides the selected one thereof to address logic 9. A control block 25 of inversion circuitry 20 provides signaling to multiplexing logic 23 for selecting between the external address 24 and the output of counter 22. Control block 25 provides the appropriate clocking and enabling signaling to counter 22 so that counter 22 counts through the necessary sequential states for generating each memory cell address.

Inversion circuitry 20 may include first data inversion logic 26 disposed within I-O block 11 in the data output path of memory device 1 so as to selectively logically invert the data value read from memory cell array 2. First data inversion logic 26 may, for example, perform an exclusive OR or NOR boolean function on each output data line, wherein first data inversion logic 26 has a first input coupled to decoder logic 9 and a second input driven by a control signal 27 generated by control block 25. Similarly, inversion circuitry 20 may include second data inversion logic 28 disposed within I-O block 11 in the data input path of memory device 1 so as to logically invert the data value, externally provided and placed on the external data bus 12, to be written to memory cell array 2. Second data inversion logic 28 may, for example, perform an exclusive OR or NOR boolean function on each input data line, wherein second data inversion logic 28 has a first input connected to the input data line and a second input driven by a control signal 29 generated by control block 25. As can be seen, data in the data input (output) path is logically inverted by control block 25 asserting control signal 27 (29) to a data high value. By inverting the data values stored in memory cell array 2 and the data values read from and to be written thereto using circuitry within memory device 1, the data inversion is substantially transparent to the system in which memory device 1 is disposed.

Inversion circuitry 20 may include multiplexing logic 30 which receives an external read/write control signal 31 and a read/write control signal 32 generated by control block 25. Control block 25 also generates a select signal to provide the selected one of external read/write control signal 31 and read/write control signal 32 to control circuit 13. Inversion circuitry 20 may further include a nonvolatile bistable storage element 33, such as a flip flop or latch including one or more ferroelectric capacitor elements, which is set to a first state when memory device 1 maintains inverted data, and a second state when memory device 1 maintains non-inverted data. Nonvolatile bistable storage element 33 may be controlled by control block 25. Control block 25 may further assert a memory inaccessible output signal 34 during the time inversion circuitry 20 is inverting the stored data values so as to inform external circuitry that memory device 1 is inaccessible.

When enabled, inversion circuitry 20 logically inverts the data values stored in memory cell array 2, and logically inverts the data values read from and to be written to memory cell array 2 during the time the stored data values are logically inverted. Memory device 1 may include enable circuitry 40 that enables inversion circuitry 20. In accordance to a first embodiment of the present invention, enable circuitry 40 enables inversion circuitry 20 when memory device 1 and/or the integrated circuit chip having memory device 1 powers up. Referring to FIG. 1, enable circuitry 40 asserts an enable signal 41 whenever the high reference voltage Vdd is initially applied to memory device 1. Accordingly, enable circuitry 40 includes power up detect circuitry that detects when the high reference voltage Vdd crosses a predetermined voltage level in a positive direction, and asserts and/or places a pulse onto enable signal 41. The specific power up detect circuitry is known in the art and thus is not shown for reasons of simplicity. In response to receiving the asserted and/or pulsed enable signal 41, inversion circuitry 20 inverts the stored data values stored in memory device 1. Thereafter, inversion circuitry 20 inverts data read from and data to be written to memory device 1. By enabling the data inversion operation upon device power up, the ferroelectric capacitor elements in memory cell 3 are less inclined to exhibit the effects of imprint.

Figure 3:
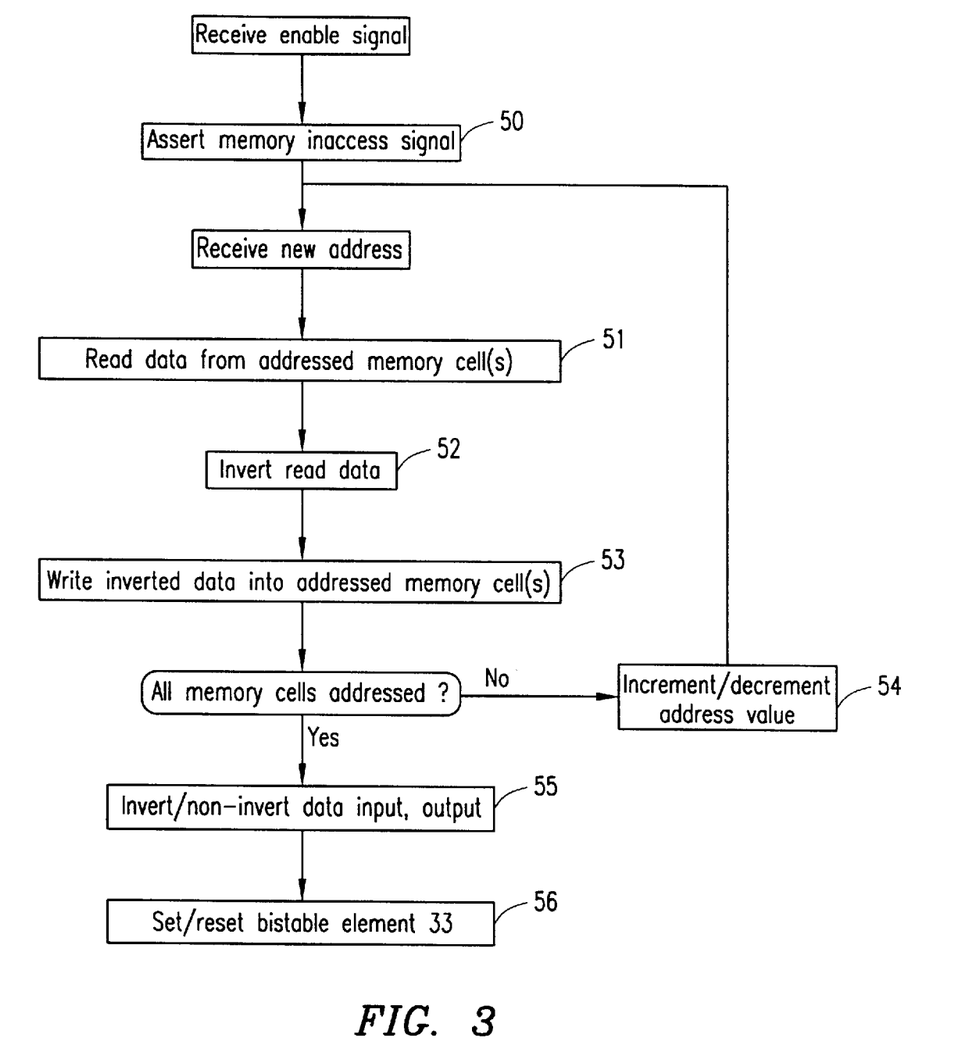
FIG. 3 is a flow chart illustrating an operation of the memory device shown in FIG. 1.

The data inversion operation of memory device 1 of FIG. 1 will be described with reference to FIG. 3. Initially, memory device 1 is not powered up. When the high reference voltage supply Vdd ramps upwardly from zero volts towards the operative voltage level, such as 3 v or 5 v, enable circuitry 40 detects the high reference voltage supply Vdd surpassing the predetermined voltage level, such as 2 v, and asserts enable signal 41 in response thereto. Upon receiving the asserted enable signal 41, inversion circuitry 20 may initially assert memory inaccessible signal 34 at step 50 to indicate that memory device 1 may not be accessed.

In general terms, inversion circuitry 20 next reads the data value from a memory cell 3 or set thereof at step 51 using the address provided by counter 22, inverts the data value read from memory cell(s) 3 at step 52, and writes the inverted data value back into the memory cell(s) 3 at step 53. Inversion circuitry 20 performs the read operation (step 51) and write operation (step 53) by control block 25 suitably controlling multiplexing logic 23 and 30. In performing the data inversion (step 52), control block 25 logically inverts the data path by asserting either control signal 27 or 29.

Following the initial read, data inversion and write operations, counter 22 may be incremented or decremented to generate a new address value at step 54. Thereafter, steps 51–53 are repeated using the new address value so as to invert the data value in memory cell 3 or set of memory cells 3 addressed thereby. Steps 51–54 are repeated until the data value stored in each memory cell 3 has been logically inverted.

Upon completing the inversion of the stored data values, control block 25 asserts control signals 27 and 29 at step 55 so that data values read from and written to memory device 1, respectively, are inverted during externally initiated memory access operations. Control signals 27 and 29 remain asserted so long as the data values in memory cell array 1 are inverted. Control block 25 also sets bistable storage element 33 at step 56 so as to indicate that the stored data values are inverted.

When memory device 1 and/or the integrated circuit chip in which memory device is disposed is powered up again, the steps 51–54 are repeatedly performed as described above to logically invert the stored data values in memory cells 3 a second time. At this point, memory device 1 stores non-inverted data values. Following this second data inversion, control block 25 de-asserts control signals 27 and 29 at step 55 so that data values read from and to be written to memory device 1 are no longer inverted. Control block 25 resets storage element 33 at step 56 so as to indicate that the stored data values are no longer inverted.

It is understood that inversion circuitry 20 may be enabled at times other than at device power up. In a second embodiment of the present invention, enable circuitry 40 asserts enable signal 41 on a substantially periodic basis. In particular, enable circuitry 40 may include a counter 44 (FIG. 4) that receives a clock signal, such as a system clock signal 45 and/or a clock signal applied to memory device 1 in the event that memory device 1 is a synchronous memory device. When counter 44 has counted a predetermined number of clock cycles appearing on system clock signal 45, counter 44 asserts enable signal 41 to initiate the data inversion process (steps 51–56 in FIG. 3).

Figure 4:
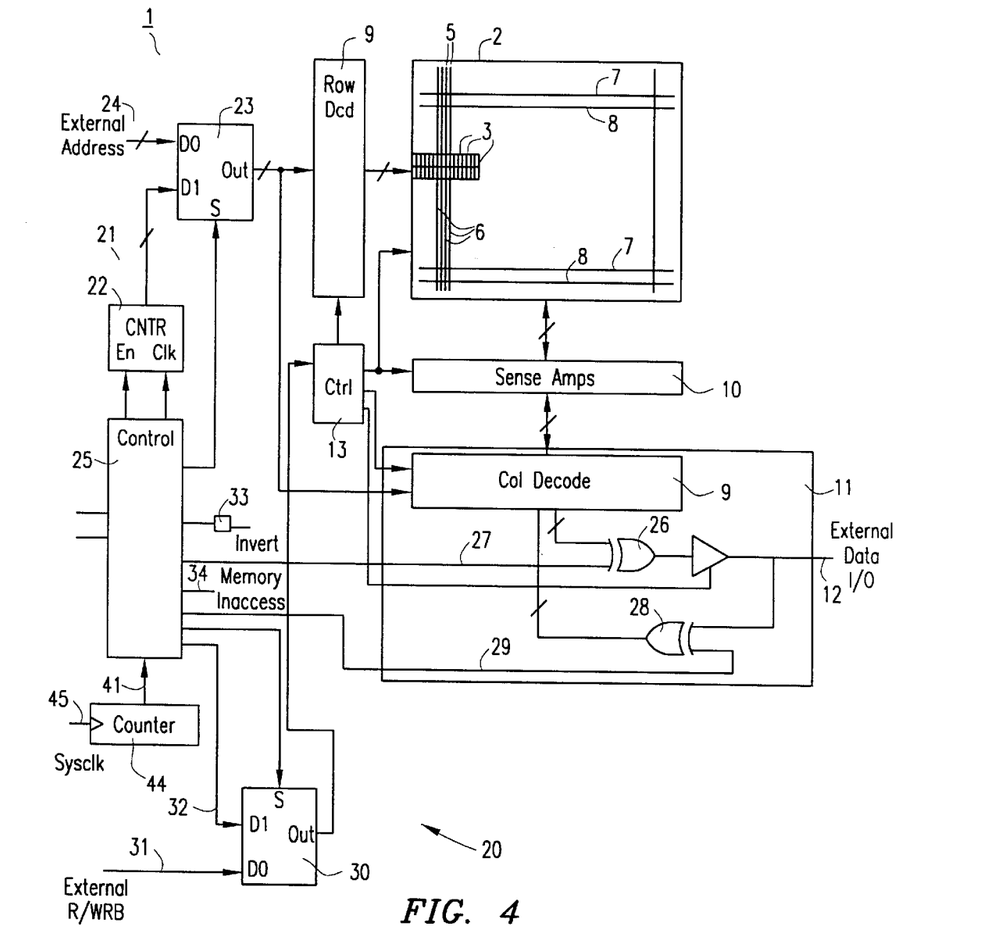
FIG. 4 is a function block diagram of a memory device according to second embodiment of the present invention.

In order to maintain and/or preserve the state of counter 44 when memory device 1 and/or the integrated circuit chip is powered down, counter 44 may include bistable storage circuits, such as flip flops, formed using ferroelectric capacitor elements. In this way, the data values stored in memory device 1 may be inverted on a substantially periodic basis even if memory device 1 is temporarily powered down.

Figure 5:
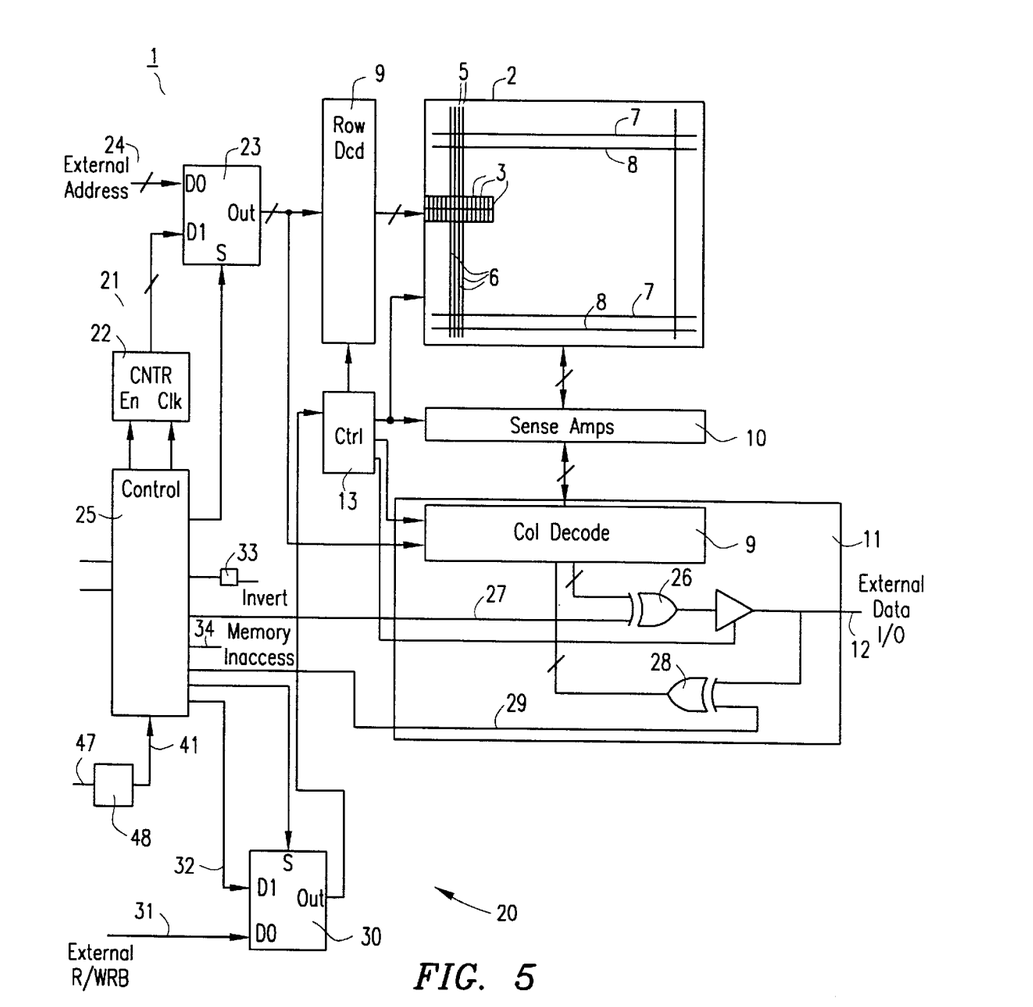
FIG. 5 is a function block diagram of a memory device according to a third embodiment of the present invention.

According to a third embodiment of the present invention, inversion circuitry 20 may perform the stored data inversion operations upon receiving an enable signal 47 generated externally to memory device 1. In this embodiment shown in FIG. 5, enable circuitry may merely include a buffer/inverter 48, one shot, or other circuit that receives the external enable signal 47 and provides enable signal 41 to control block 25. In this way, the external enable signal 47 may be programmed in system level software or elsewhere to initiate the data inversion operations (steps 51–56 in FIG. 3) at predetermined times and/or at predetermined intervals, such as on a periodic basis. The third embodiment of the present invention advantageously allows for the performance of the data inversion operations to be based upon the specific ferroelectric film used in the ferroelectric capacitor elements in memory cells 3.

Figure 6:
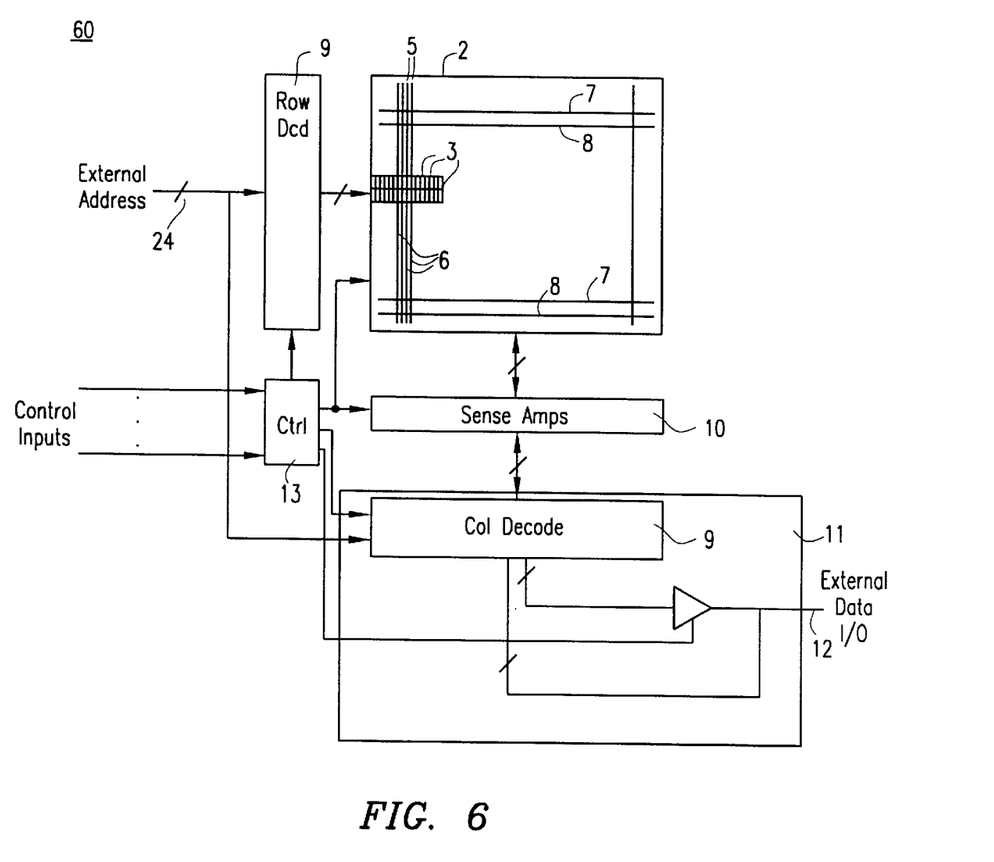
FIG. 6 is a function block diagram of a memory device according to a fourth embodiment of the present invention.

It is understood that the data inversion operations may be performed without any additional circuitry, such as without inversion circuitry 20 and enable circuitry 40 (FIG. 6). According to a fourth embodiment of the present invention, an external algorithm, such as an algorithm embedded within system software or elsewhere, provides the addressing, control and data inversion signaling to memory device 60 to perform the data read (step 51), data inversion (step 52) and data write (step 53) operations, as well as the data input/output inversion (step 55). The system in which memory device 60 is embedded is thus responsible for performing all of the steps in the data inversion operations as well as maintaining the state of memory device 60 (storing inverted or non-inverted data).

It is understood that the present invention may be directed to ferroelectric circuits other than the ferroelectric random access memory device 1 described above. For example, inversion circuitry 20 and enable circuitry 40 may be included within and/or configured to cooperate with a shadow static random access memory device utilizing ferroelectric capacitors. Further, inversion circuitry 20 and enable circuitry 40 may be utilized within and/or in conjunction with a register or register bank having ferroelectric capacitors.

Figure 7:
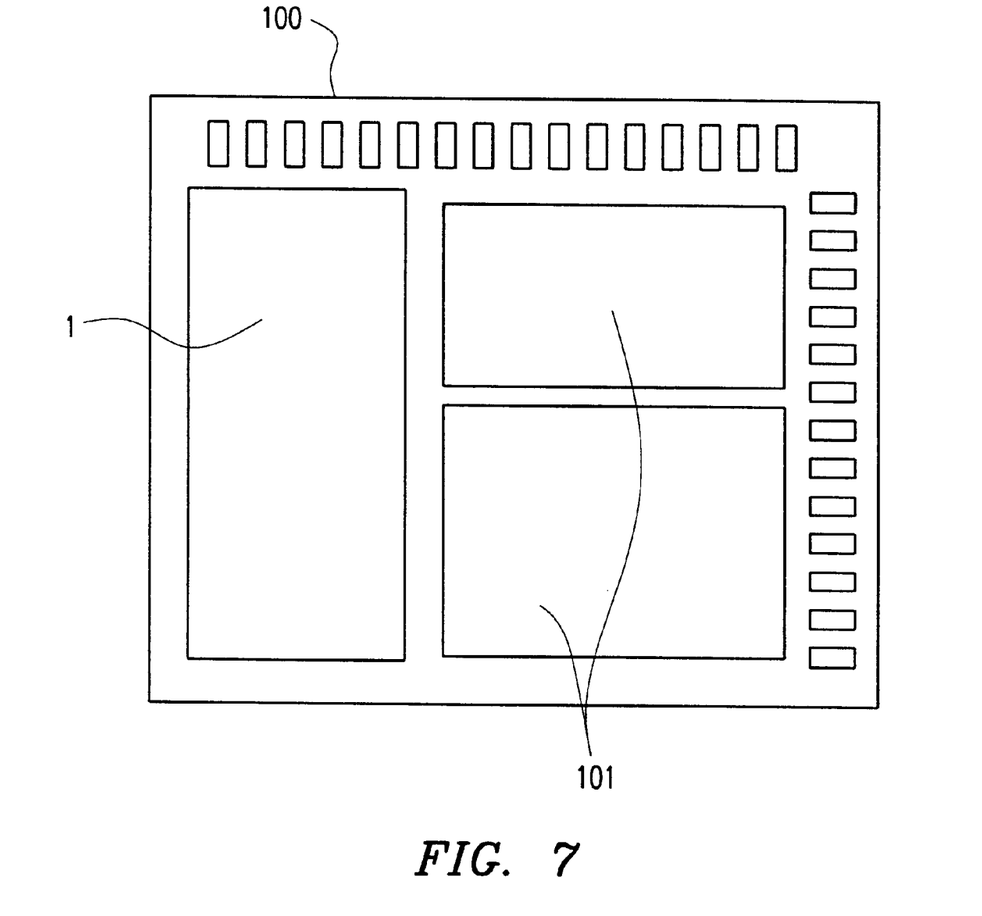
FIG. 7 is a diagram of an integrated circuit chip having a memory device disposed thereon, according to an embodiment of the present invention.

It is understood that memory devices 1 and 60 may be stand-alone memory devices or an embedded memory devices within an integrated circuit chip, such as an application specific integrated circuit chip 100 having additional circuitry 101 (FIG. 7).

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An integrated circuit, comprising:
   a memory circuit, comprising:
      at least one ferroelectric element configurable into one of a plurality of polarization states, each polarization state representing a distinct data value;
      a first circuit, coupled to the at least one ferroelectric element, for selectively determining the data value corresponding to the polarization state of the at least one ferroelectric element, and substantially immediately thereafter configuring the at least one ferroelectric element into a polarization state that is different from the determined polarization state; and
      a second circuit, coupled to the first circuit, for enabling the first circuit at a predetermined time.

2. The integrated circuit of claim 1, wherein:
   the memory circuit receives a data input signal and configures the at least one ferroelectric element in one of the polarization states corresponding to a value of the data input signal, and provides a data output signal having a value corresponding to the one of the polarization states; and
   the memory circuit further comprises a third circuit, coupled to the ferroelectric element and the second circuit, for selectively logically inverting the data input signal provided to the memory circuit and the data output signal provided thereby.

3. The integrated circuit of claim 2, wherein:
   the third circuit includes at least one logic gate that receives the data input signal and a control signal from the second circuit and generates a signal that is coupled to the ferroelectric element.

4. The integrated circuit of claim 2, wherein:
   the third circuit includes at least one logic gate that receives a signal having a data value corresponding to the polarization state of the ferroelectric element and a control signal from the second circuit and generates a signal that is coupled to the data output signal.

5. The integrated circuit of claim 1, wherein:
   the first circuit includes an input terminal; and
   the second circuit includes a power-up detection circuit, coupled to a reference voltage supply and including an output terminal coupled to the input terminal of the first circuit, for asserting the output terminal upon the integrated circuit being powered up.

6. The integrated circuit of claim 1, wherein the second circuit comprises:
   a counter circuit which receives a clock input signal and asserts an output enable signal upon the occurrence of a predetermined number of cycles appearing on the clock input signal, the output enable signal being received by the first circuit.

7. The integrated circuit of claim 6, wherein:
   the counter circuit includes a plurality of nonvolatile storage elements.

8. The integrated circuit of claim 7, wherein:
   the nonvolatile storage elements of the counter circuit comprise bistable storage circuits including ferroelectric elements.

9. The integrated circuit of claim 1, wherein:
   the second circuit receives a system-generated signal and asserts an enable signal in response thereto, the output signal being an input to the first circuit.

10. The integrated circuit of claim 1, wherein the memory circuit is a ferroelectric memory device, the ferroelectric memory device comprising:
    an array of ferroelectric memory cells organized into a plurality of rows and columns, wherein each row of ferroelectric memory cells is connected to a distinct word line and a distinct plate line, and each column of ferroelectric memory cells is connected to a distinct pair of bit lines, each memory cell including at least one ferroelectric element;
    address decode circuitry, coupled to the word lines and plate lines, for receiving an input address and connecting a row of ferroelectric memory cells to the bit lines in response; and
    data input-output circuitry, coupled to the bit lines, for providing input data to be written to the array of ferroelectric memory cells and providing output data read from the array of ferroelectric memory cells to circuitry external to the semiconductor memory device.

11. The integrated circuit of claim 10, wherein:
    for each ferroelectric memory cell, the first circuit substantially automatically reads the ferroelectric memory cells to obtain the data values stored therein, inverts the data values read and writes the inverted data values into the ferroelectric memory cells.

12. The integrated circuit of claim 11, wherein:
    the first circuit successively generates an address corresponding to each ferroelectric memory cell for sequentially reading the data values corresponding to the polarization states of ferroelectric elements in the memory cells.

13. The integrated circuit of claim 1, wherein:
    the memory circuit is embedded within the integrated circuit; and
    the integrated circuit comprises an application specific integrated circuit.

14. A method of maintaining data in a memory device having a plurality of memory cells arranged in rows and columns of memory cells, comprising the steps of:
    at a first predetermined time, logically inverting the data value stored in each memory cell.

15. The method of claim 14, wherein the step of logically inverting comprises the steps of:
    reading the data value stored in each memory cell; and
    for each memory cell, writing a data value therein that is the logical complement of the data value read from the memory cell substantially immediately following the step of reading.

16. The method of claim 14, wherein:
    the first predetermined time occurs when the memory device is not being accessed; and
    the method further comprises the step of logically inverting the value of data to be written to the memory device during memory access write operations following the step of logically inverting.

17. The method of claim 14, further comprising the step of:

the first predetermined time occurs when the memory device is not being accessed; and the method further comprises the step of logically inverting the value of data read from the memory device during memory access read operations following the step of logically inverting.

18. The method of claim 14, further comprising the steps of:

receiving an indication of an occurrence of a second predetermined time; and logically inverting the data value stored in each memory cell following the second predetermined time.

19. The method of claim 18, wherein:

the first and second predetermined times occur when the memory device is not being accessed;

between the first and second predetermined times, logically inverting data values provided to the memory device during memory access write operations; and between the first and second predetermined times, logically inverting data values that are read from addressed memory cells in the memory device during memory access read operations.

20. The method of claim 19, further comprising the steps of:

logically non-inverting the value of data to be written to the memory device during memory access write operations following the second predetermined time; and logically non-inverting the value of data read from addressed the memory cells of the memory device during memory access read operations following the second predetermined time.

21. The method of claim 14, wherein:

the predetermined time occurs substantially immediately following the memory device powering up.

22. The method of claim 14, further comprising the steps of:

periodically receiving an indication of an occurrence of a plurality of first predetermined times; and the step of logically inverting logically inverts data values stored in each memory cell upon reception of each indication of the first predetermined time occurrences.

23. The method of claim 22, wherein:

the first predetermined times occur substantially periodically.

24. The method of claim 14, further comprising the steps of:

receiving a clock signal;

counting the number of clock periods appearing on the clock signal; and indicating an occurrence of the first predetermined time following the number of clock periods at least equaling a predetermined number.

25. The method of claim 24, further comprising the step of:

maintaining the value of the number of clock periods that appeared on the clock signal following the memory device powering down.

26. The method of claim 14, wherein:

the memory device is a ferroelectric memory device.

27. A ferroelectric memory device, comprising:

a plurality of ferroelectric memory cells; and circuitry for logically inverting the data value stored in each ferroelectric memory cell following an occurrence of a predetermined time during at least one period when the ferroelectric memory device is not being externally accessed.

28. The ferroelectric memory device of claim 27, wherein:

the circuitry performs one or more read operations to determine the data value stored in each memory cell, and one or more write operations that writes the logical inversion of the determined data values into the corresponding memory cells.

29. The ferroelectric memory device of claim 27, further comprising:

circuitry for logically inverting the value of data to be written to the ferroelectric memory device following the at least one period when the ferroelectric memory device is not being externally accessed.

30. The ferroelectric memory device of claim 27, further comprising:

circuitry for logically inverting the value of data read from the ferroelectric memory device following the at least one period when the ferroelectric memory device is not being externally accessed.

31. The ferroelectric memory device of claim 27, further comprising:

data input circuitry for logically inverting the value of the data to be written to the ferroelectric memory device during memory access operations between successive predetermined time occurrences; and data output circuitry for logically inverting the value of the data read from addressed ferroelectric memory cells during memory access operations between the successive predetermined time occurrences.

32. The ferroelectric memory device of claim 27, wherein:

the circuitry for logically inverting logically inverts the data value stored in each ferroelectric memory cell following the occurrence of a predetermined time during each of a plurality of periods when the ferroelectric memory device is not being externally accessed.

33. The ferroelectric memory device of claim 27, further comprising:

circuitry for asserting an enable signal following the ferroelectric memory device powering up, the assertion of the enable signal indicating the occurrence of the predetermined time and being received by the circuitry for logically inverting.

34. The ferroelectric memory device of claim 27, further comprising:

timing circuitry for receiving a clock signal and asserting an enable signal following the occurrence of a predetermined number of clock cycles appearing on the clock signal, the enable signal being received by the circuitry for logically inverting for identifying the at least one predetermined time.

35. The ferroelectric memory device of claim 34, wherein:

the timing circuitry includes one or more ferroelectric bistable storage circuits.

36. A ferroelectric memory device, comprising:

a plurality of ferroelectric memory cells; and a first circuit, coupled to the ferroelectric memory cells, for conditioning the data stored therein during at least one period of memory access inactivity so as to substantially reduce effects of imprint in the ferroelectric memory cells.

37. The ferroelectric memory device of claim 36, wherein:

the first circuit comprises a second circuit that, when enabled during the at least one period of memory access inactivity, logically inverts the data values stored in each ferroelectric memory cell.

38. The ferroelectric memory device of claim 37, wherein:

for each ferroelectric memory cell, the second circuit reads the data value stored in the ferroelectric memory cell, logically inverts the data value read therefrom, and writes the inverted data value into the ferroelectric memory cell.

39. The ferroelectric memory device of claim 38, wherein:

the second circuit includes addressing circuitry to sequentially generate address values for addressing each ferroelectric memory cell.

40. The ferroelectric memory device of claim 39, wherein:

the addressing circuitry comprises a counter.

41. The ferroelectric memory device of claim 36, wherein:

the first circuit substantially conditions the data stored in the ferroelectric memory cells during a plurality of periods of memory access inactivity.

42. The ferroelectric memory device of claim 41, wherein:

the first circuit substantially periodically conditions the data stored in the ferroelectric memory cells.

43. The ferroelectric memory device of claim 42, wherein:

the first circuit includes a counter circuit having an input driven by a clock signal and generating an enable signal to initiate conditioning of the ferroelectric memory cells after a predetermined number of clock periods appears on the clock signal.

44. The ferroelectric memory device of claim 43, wherein:

the counter circuit comprises a plurality of bistable storage element s, each bistable storage element including one or more ferroelectric capacitive elements.

45. The ferroelectric memory device of claim 41, wherein:

the first circuit includes a power up detection circuitry for generating an enable signal to initiate conditioning of the ferroelectric memory cells upon the ferroelectric memory device powering up.

46. The ferroelectric memory device of claim 41, wherein:

the first circuit further comprises second circuitry for inverting data values associated with memory access operations following the at least one period of memory access inactivity.

47. The ferroelectric memory device of claim 46, wherein:

the first circuit conditions the data stored in the ferroelectric memory cells during periods of memory access inactivity; and the second circuitry inverts the data values associated with memory access operations.

* * * * *